US009551754B2

(12) United States Patent
Filangeri et al.

(10) Patent No.: US 9,551,754 B2
(45) Date of Patent: Jan. 24, 2017

(54) TEST DEVICE FOR KINETIC SWITCHES AND METHOD OF TESTING KINETIC SWITCHES

(71) Applicant: CIRCOR AEROSPACE, INC., Hauppauge, NY (US)

(72) Inventors: Frank A. Filangeri, Lake Ronkonkoma, NY (US); John J. Campanella, East Yaphank, NY (US)

(73) Assignee: Circor Aerospace, Inc., Hauppauge, NY (US)

( * ) Notice: Subject to any disclaimer, the term of this patent is extended or adjusted under 35 U.S.C. 154(b) by 52 days.

(21) Appl. No.: 14/545,678

(22) Filed: Jun. 5, 2015

(65) Prior Publication Data
US 2016/0356853 A1  Dec. 8, 2016

(51) Int. Cl.
*G01R 31/327* (2006.01)

(52) U.S. Cl.
CPC .................. *G01R 31/3277* (2013.01)

(58) Field of Classification Search
CPC combination set(s) only.
See application file for complete search history.

(56) References Cited

U.S. PATENT DOCUMENTS

| 5,362,291 | A | 11/1994 | Williamson, IV |
| 6,062,078 | A * | 5/2000 | Meisberger ............. G01M 1/14 73/1.87 |
| 7,055,368 | B2 * | 6/2006 | Schneider ............... B04B 9/146 494/10 |
| 8,154,175 | B2 | 4/2012 | Schmidt |

* cited by examiner

Primary Examiner — Clayton E LaBalle
Assistant Examiner — Jas Sanghera
(74) Attorney, Agent, or Firm — McNees Wallace & Nurick LLC (57) ABSTRACT

Test apparatus and method of testing kinetic switches. The test apparatus utilizes an RFID device attached to a high speed centrifuge on which the kinetic switches are mounted for testing. Sensors monitor the operation of the kinetic switch for movement from a first position to a second position. In addition, the speed of the centrifuge at the time of the movement is determined. This information may be transmitted in real time as received by the RFID device or saved in RFID memory and transmitted to determine the force applied to the kinetic switch at the time of the movement so that the acceptability of the kinetic switch can be determined.

23 Claims, 9 Drawing Sheets

TEST DEVICE FOR KINETIC SWITCHES AND METHOD OF TESTING KINETIC SWITCHES

FIELD OF THE INVENTION

The present invention is directed to a device for testing kinetic switches and a method of testing, and specifically to the use of an RFID circuit for testing kinetic switches.

BACKGROUND OF THE INVENTION

Kinetic switches are used in various applications such as kinetic ordnance, flight recorders, missiles, guided and unguided rockets, aircraft applications and other critical applications. Kinetic switches may be hermetically sealed with inert gas for high reliability, aggressive environmental applications and they may be available in numerous sizes and packages. Kinetic switches may be un-damped, air damped or fluid damped. They may be normally open or normally closed. Kinetic switches are available as acceleration/Inertia/impact switches for applications involving acceleration, spin, impact, recoil, directional sensing vibration and g-time products available Kinetic switch designs may be tailored to specific electronic and environmental requirements. These switches are designed to respond to acceleration/deceleration in excess of a predetermined value.

Kinetic switches may be used to generate a wake-up signal to a dormant circuit in response to the beginning of an impact event, thereby activating the circuit. In its simplest embodiment, the kinetic switch may be a simple on/off switch that switches from one position, for example off, to a second position, on in response to an acceleration or deceleration event such as an impact event. An impact event may be an object striking the ground from the air, the impact causing the kinetic switch to activate a circuit. A kinetic switch may be used to trigger the inflation of an airbag in a vehicle in the event of an impact event exceeding the threshold limits of the switch.

U.S. Pat. No. 8,154,175 describes one such kinetic switch which comprises a snap mechanism provided between an input element and an output element to provide a bistable switch having two discrete positions. A first position P1 is indicative of the input state being below a given threshold, or "off" position, and a second position P2, which is indicative of the input state being at or above the threshold, or "on" position. The snap mechanism maintains a positive reacting force throughout the operating stroke of the output element. A disc in the snap mechanism deflects as the input increases until a maximum threshold force is applied to the disc at which point the disc "snaps" over. A stem provides the input element (receiving a force F) and the output element. A structure supports a snap element connected to a stem. The snap element, which may be a flexible disc, has a concave configuration with the stem in the first position P1. Upon the force F reaching a threshold force, the snap element is deflected to a convex configuration that moves the stem to the second position P2 or on position. Stops limit the travel of the stem.

Regardless of the design of the kinetic switch, it must operate reliably for its intended function, particularly for some of the critical applications described above. To assure that these kinetic switches properly operate, they are tested to assure that they switch from a first position to a second position when the predetermined set point is reached. The predetermined set point may vary from one design to the next, but the switch must reliably function when the predetermined set point is reached.

Kinetic switches are tested by placing them on a centrifuge and rotating them at high speeds. One or more kinetic switches may be tested simultaneously by mounting the switches to the centrifuge. As the centrifuges are accelerated up to speed, the switches are monitored to determine if they switch from a first position to a second position as the centrifuge reaches the predetermined speed. Each switch is connected to a test circuit that determines whether the switches in fact switch from a first position to a second position as the predetermined speed is reached, generating a signal or signals. The signal or signals are transmitted to a computer monitoring the testing via a slip ring or slip rings, which enable the transfer of signals across a rotating surface. The computer may be used to store the data indicative of the force at which each switch is activated.

One of the problems currently faced is that as the kinetic switch requirements have become more stringent, some of the forces reaching 80,000 Gs with centrifuge speeds reaching in excess of 26,000 rpm, slip ring wear also is accelerated. The slip rings are utilized to transmit data from test circuits evaluating the performance of each of the rapidly rotating kinetic switches as the rotational speed increases. Further reduction in slip ring life will result as kinetic switches requiring even higher G-forces are developed. Furthermore, chatter resulting from slip ring wear results in transmission of erroneous test data, which may lead to kinetic switches being rejected when in fact they should be accepted. Transmission of test data using wireless monitors is also not a viable solution since these wireless monitors require on-board transmitters requiring on-board batteries to transmit the test results. Of course, the batteries include chemical components which will not survive the high speeds of centrifugation for extended periods of time, experiencing premature failure and frequent replacement as well as messy and inconvenient clean-up.

What is needed is a device that can monitor the operation of kinetic switches during testing and transmit the measured test data to a recording device so that each of the tested kinetic switches and be tested to determine acceptable operation at a predetermined speed. The device must be able to both determine switch operation and transmit data indicating whether the switch operation occurs at the predetermined speed without the use of a self-contained power supply, while also eliminating the use of slip rings as a communication device.

SUMMARY OF THE INVENTION

The present invention contemplates the use of radio frequency identification devices (RFIDs) for wireless monitoring and transfer of test data of kinetic switches tested on high speed centrifuges. As used herein, kinetic switches include kinetic sensors, accelerometers, piezoelectric sensors and similar devices that move from a first position to a second position upon being subject to a predetermined force.

RFIDs comprise a small chip with a built in antenna, referred to herein as the RFID device. An RFID device may include the chip embedded in or otherwise assembled to a substrate, and an RFID system further includes a scanning antenna with a transponder in proximity to the RFID device. An RFID device may also include a chip printed on a flexible substrate also in close proximity to a scanning antenna. As used herein, an RFID device may be a chip assembled to a substrate, embedded in a substrate, printed on a flexible substrate or any other structure that transmits radio frequency identification and associated information, which information is received by a proximately positioned scanning antenna. The chip may be a simple device that enables transmission of information or may be a complex device that also additionally performs complex functions and calculations. As used herein, an RFID system includes an RFID device, a scanning antenna and optional transponder. Each RFID device also may include a data memory capable of storing a small amount of information. An RFID device may include a specially designed circuit that may be designed to receive information and optionally store the received information in its memory. The RFID device may be programmed with programmable software which may be changed as well as read-only memory, which may include unique serial number information that identifies the RFID device. The program may also manipulate or condition data before storing it in an optional memory.

Passive RFID devices do not require batteries and do not include their own power source. Active RFID devices do require their own power sources, such as batteries, and thus are subject to the limitations previously set forth with respect to wireless monitors. However, the present invention contemplates the use of wireless RFID devices which may be passive and which, under certain conditions, may be active. Active RFID devices derive their power from sources not subject to deterioration from the high rotational speeds related to centrifuge operation. The problem with the high rotational speed may be alleviated by proper placement of an active RFID device powered by a battery. Active RFID devices may be alternatively powered, such as for example, by a rechargeable capacitor that can be recharged using the same principles for operating passive RFID devices. RFID devices may be provided with read/write capability.

RFID devices are very adaptable as they may be embedded in plastic, assembled to circuit boards, such as fiberglass boards, or other material for protection or they may be provided on thin flexible strips using known technologies. The RFID devices for the present invention can be provided in any form that can be used with the centrifuges used for testing kinetic switches as set forth herein. The RFID devices may transmit information in real time. Alternatively, RFID devices equipped with memory storage may store information and "go to sleep", that is, become inactive until they are interrogated or "awakened" so that the stored information may be transmitted at a later time.

A scanning antenna is a part of the RFID system but is not integral with the RFID device. The scanning antenna, generally located in proximity to the RFID device, sends out a radio signal interrogating the device. The radio signal may provide the energy for the RFID device to operate when it is a passive device. Depending on the programming of the RFID device, after being interrogated, it may automatically transmit information stored in its memory and then in sequence, clear the RFID memory so that it may be reused. The information in the memory transmitted by the RFID device can then be received by the scanning antenna, sent to a signal processor and stored in a computer until needed again. As noted previously, RFID devices also may transmit data in real time, the data being transmitted as it is collected. Of course, RFID systems have been used in other applications and RFID technology is not new.

The present invention contemplates the use of RFID technology in the testing of kinetic switches. RFID systems may be designed to receive information from circuitry used for testing kinetic switches and then providing that information via RF transmission without the use of slip rings to custom software that determines the acceptability of the tested kinetic switches.

A testing system for kinetic switches comprises an RFID system that includes an RFID device and associated scanning antenna. The RFID device is removably attached to a centrifuge. One or more test circuits, also removably attached to the centrifuge are placed in communication with the RFID device. The test circuit detects and transmits a signal generated when a kinetic switch being tested is activated, that is, moves from a first position to a second position, the signal being received by the RFID device. The speed of the centrifuge when the kinetic switch moves from a first position to a second position is monitored and custom software analyzes the acceptability of each kinetic switch based upon the speed of the centrifuge when the kinetic switch moves from the first position to the second position. The speed of the centrifuge may be measured by any available known technology.

The scanning antenna is positioned in proximity to the test circuits rotationally mounted in the centrifuge. The scanning antenna is in a fixed location and is not positioned on the rotating portion of the centrifuge. The scanning antenna is in communication with the RFID device generating a radio frequency (RF) pulse received by the RFID device, providing energy for the operation of the RFID device. The scanning antenna also receives information from and may provide information to the RFID device. The RFID system may also include a signal analyzer, or the signal analyzer may be an independent unit or part of a computer having analytical and storage capabilities. However, signal analyzer receives information or data from the scanning antenna. The scanning antenna transmits information received from the RFID device and transmits it to the signal analyzer for evaluation, the evaluation then being stored in associated computer storage or memory as data. The raw signal transmitted from the RFID device also may be stored in the computer memory and analyzed at a later time. The order of analysis and storage is not important, as the raw signal transmitted from the RFID device may be received by the scanning antenna, transmitted to the analyzer, evaluated and stored. Alternatively the raw signal transmitted from the RFID device may be received by the scanning antenna, transmitted to the memory of the computer and then retrieved at a later time from the computer memory for evaluation.

In operation, a kinetic switch is mounted at a predetermined location on a centrifuge. The predetermined location on the centrifuge is at a precise distance from the rotational axis of the centrifuge. The kinetic switch is connected to the test circuit and the circuit is connected to the RFID device removably mounted on the centrifuge. The scanning antenna is operational to provide RF energy to the RFID device. The centrifuge is activated from its stop position, rotating about its rotational axis. When the centrifuge achieves a speed sufficient to move the kinetic switch from a first position to a second position, the test circuit detects this movement of the kinetic switch. The test circuit transmits a signal indicative of this switch activity to the RFID device, and this information is sent to custom software along with the speed of the centrifuge. As noted previously, this information may be transmitted in real time or obtained from memory storage. When done from memory storage, a signal is sent from the scanning antenna that interrogates the RFID device. The information transmitted by the RFID device includes as a minimum the identification of the RFID device only if more than one RFID device is used, the position of the kinetic switch associated with the test circuitry maintained as a memory identification address or some indicia related to the identification of the kinetic switch that is tested as well as information related to the force on the kinetic switch when it was activated. This allows identification of the kinetic switch associated with a particular test circuit. The speed of the centrifuge is measured and sent to the custom software, and this speed may serve to enable calculation of the force on the kinetic switch when the kinetic switch was activated. This information is either sent to a storage device for storage, which may be associated with a computer, until ready for analysis, or sent to a signal analyzer that analyzes the signal so that the force on the kinetic switch when it was activated can be determined. The information as to the identification of the kinetic switch and the force at which it was activated can be displayed or stored for future evaluation. In this way, the acceptability or unacceptability of a kinetic switch for a particular application can be determined, the kinetic switch either passing the test by being activated at a predetermined centrifuge speed or not being activated. When an RFID device includes memory storage capabilities, after the information stored in the RFID device is received by the scanning antenna, the scanning antenna may send a signal to the RFID device instructing it to clear its memory for reuse during subsequent testing.

A clear benefit of the present invention is that testing of kinetic switches can be successfully accomplished using centrifuges without the use of expensive and life-limited slip rings. Because testing of kinetic switches becomes less accurate as slip rings deteriorate, evaluation of false results and retesting of kinetic switches is reduced, if not eliminated.

The use of RFID systems to transmit information provides a cost savings, as the cost of RFID systems, after their initial design, is low as compared to slip rings. Furthermore, the RFID device(s) physically attached to the centrifuge should have a much longer life expectancy than slip rings, since the RFID devices do not have any moving parts.

In the kinetic switch testing apparatus of the present invention, the adherence of the RFID device to the centrifuge and the connection of the test circuit to the RFID device requires no additional maintenance after initial set-up. The RFID device may be removed from the centrifuge and replaced when it no longer is functioning. The connections of the test circuit to the RFID device likewise may be repaired if not functioning properly. Since the RFID device is expected to have a much longer life than the previously used slip rings and since there are no moving parts, the reliability of the test circuit/RFID device interface as well as the RFID device is expected to be significantly greater as compared to the prior art sensor/slip ring interface and slip ring, thereby reducing inspection times and replacement times.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The present invention sets forth apparatus for reliably testing kinetic switches and a method for testing kinetic switches using the kinetic switch test apparatus. The present invention replaces the prior information transmission technology used for testing kinetic switches a centrifuge and, slip rings, replacing the slip rings with RFID technology. RFID technology includes both RFID chips and RFID tags, which terms are utilized interchangeably herein. As used herein, an RFID device is any RFID apparatus and includes RFID tags and RFID chips. An RFID tag is a substrate including an embedded RFID chip, which substrate may or may not be flexible. Depending on the application, having the chip embedded in a substrate may facilitate handling. RFID technology eliminates the electromechanical connections associated with slip rings and rotating parts and their inherent wear and loss of reliability with increasing wear. RFID technology eliminates moving parts and their associated wear and replaces it with information transmission technology utilizing radio waves for transmission technology. The radio waves are also used to power the RFID technology in a preferred embodiment of this invention.

Figure 1:
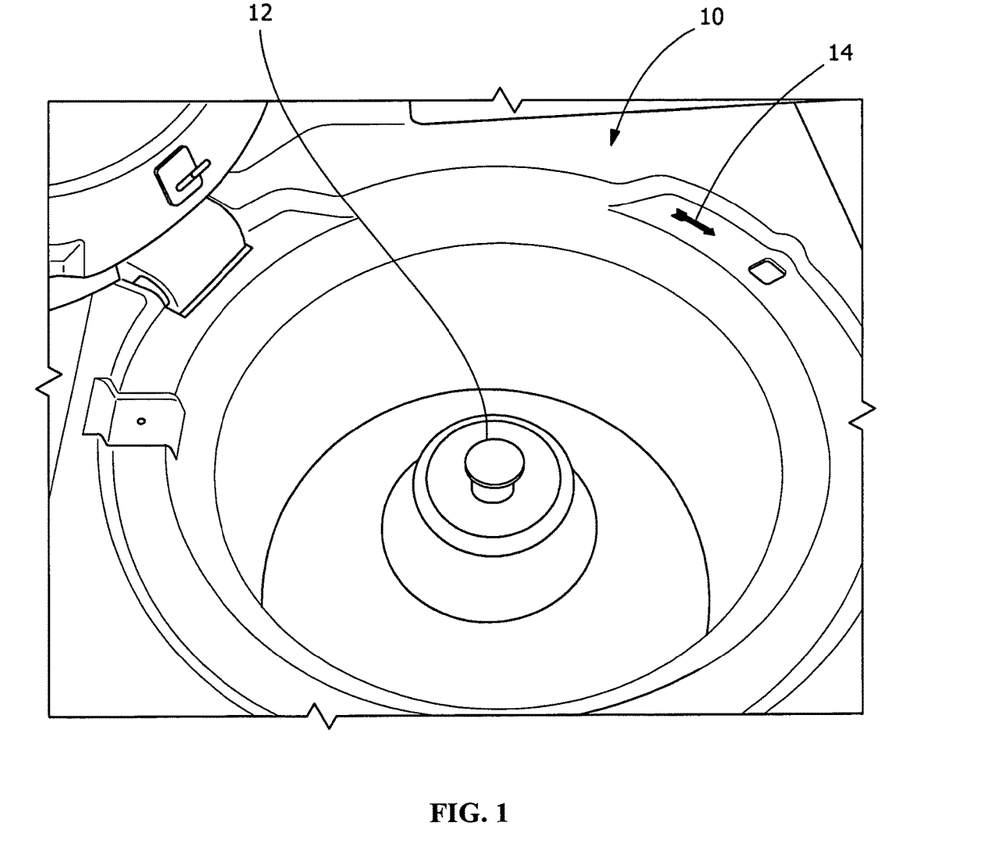
FIG. 1 depicts a centrifuge used for testing of kinetic switches.

Referring now to FIG. 1, there is depicted a standard high speed centrifuge 10 that may be used for testing of kinetic switches. FIG. 1 is a view looking into centrifuge 10 having its articulating cover assembly also referred to as lid 16 open and without the kinetic switch test equipment assembled to the centrifuge, exposing its center shaft 12. An arrow 14 near the periphery of the centrifuge indicates the direction of rotation of centrifuge 10. Because different kinetic switches are activated when exposed to different forces, there is no one preferred centrifuge, one of the relevant centrifuge characteristics being its maximum rotational speed. As a result of economic considerations, lower speed centrifuges are used to test kinetic switches that are activated at lower applied forces. Such centrifuges are generally cheaper. However, as the requirements for kinetic switches are constantly evolving, the requirements for kinetic switches have resulted in activation of switches at higher applied forces, thus requiring centrifuges that operate at higher rotational speeds.

One such centrifuge that has been modified for testing of kinetic switches is available from Beckman-Coulter, which is a standard medical centrifuge utilized for blood testing, but modified as discussed herein for kinetic switch testing. Current test requirements require a centrifuge having rotational speeds of up to about 26,000 revolutions per minute (rpm) in order to achieve a force loading of up to about 80,000 G-force, where 1 G-force is the force exerted on an object by gravity at sea level or mass of the object times its acceleration, 9.8 meters/second$^2$. As design requirements increase, the force loading required for kinetic switch testing may increase. However, currently, centrifuges are available that can achieve rotational speeds up to 150,000 rpm. It should be noted that while the test apparatus of the present invention set forth herein was developed to overcome the problems that have been exacerbated by kinetic testing at high rotational speeds, the test apparatus of the present invention is readily adaptable for use in testing kinetic switches at lower rpm speeds, since the problems experienced at higher speeds have also been experienced with testing at lower rpm speeds, but have not been as acute.

Figure 2:
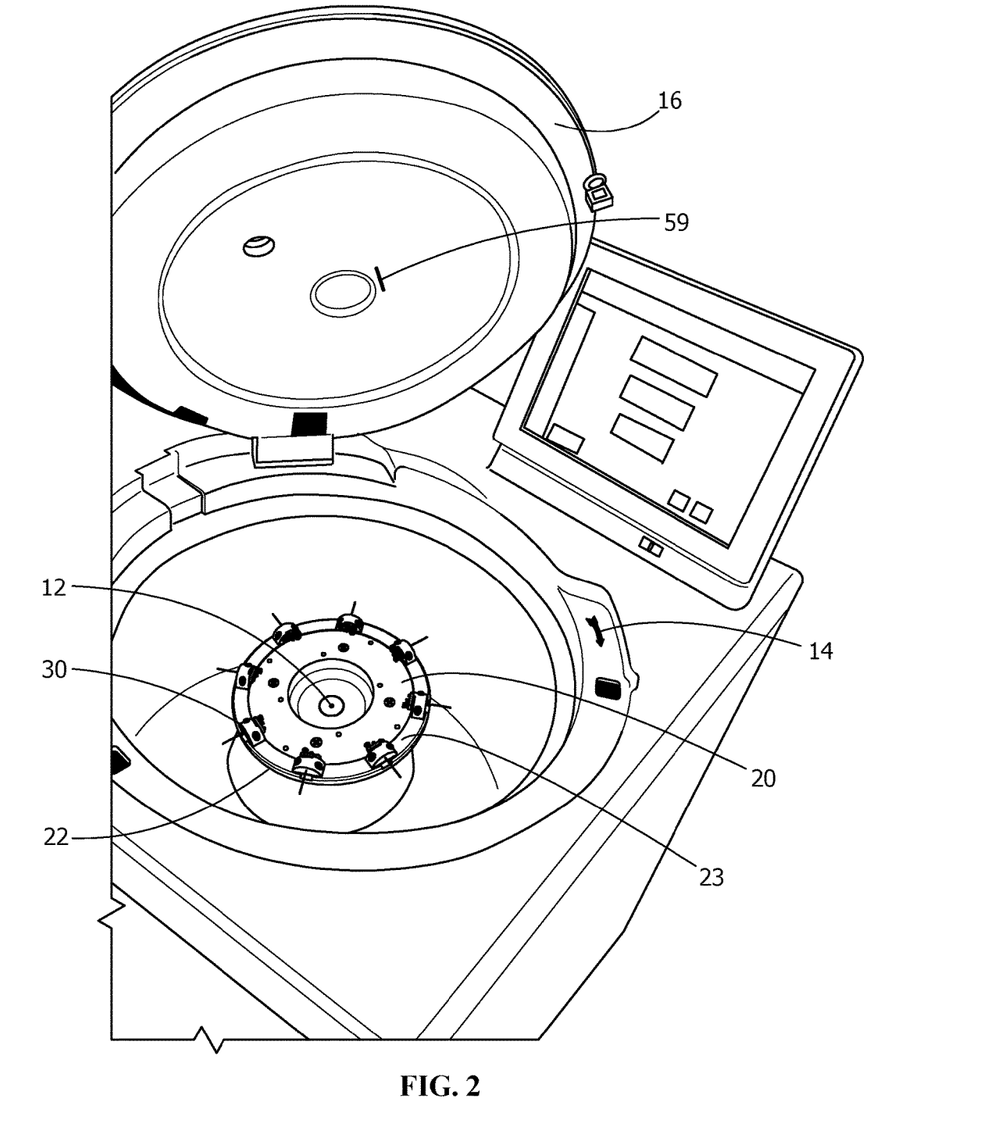
FIG. 2 depicts the centrifuge of FIG. 1 showing a test platform installed over the center shaft of the centrifuge with a plurality of test fixtures assembled along the platform periphery at the platform flange.

FIG. 2 depicts centrifuge 10 of FIG. 1 with a test platform 20 installed over center shaft 12 of the centrifuge with a plurality of test fixtures 30 assembled along a periphery 22 of test platform 20. Centrifuge lid 16 is depicted in an open position. In the open position, scanning antenna 59 is visible near the center of lid 16 so that scanning antenna is proximate to the RFID device when lid 16 is closed. Scanning antenna 59 is connected by circuitry (not visible) to other test equipment.

Figure 3:
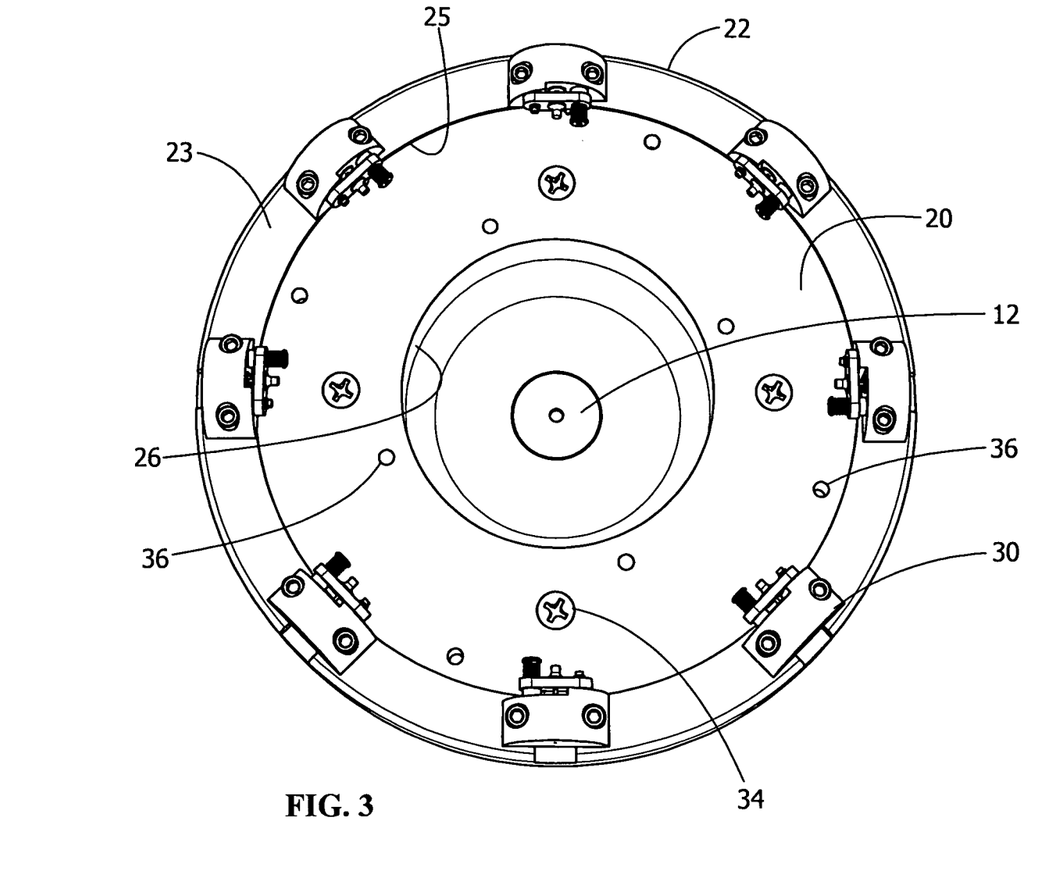
FIG. 3 is a top view of the test platform of FIG. 2, the test platform assembled to the centrifuge.

FIG. 3 is a top view of the test platform 20 of FIG. 2, the test platform 20 assembled to centrifuge 10. This top view discloses more detail of test platform 20. Evident in FIG. 3 are a plurality of fasteners 34 that removably attach test platform 20 to center shaft 12 of centrifuge 10. Test platform includes a plurality of test fixtures 30 equally spaced around the periphery 22 of test platform 20. In FIG. 3, the plurality of test fixtures 30 are positioned on a flange 23 of platform 20. Test platform includes a first counterbore 25 that has a diameter formed by flange 23, this counterbore being somewhat shallow. Test platform 20 further includes a second counterbore 26, which is deeper with a smaller diameter, positioned substantially over the center shaft 12 of centrifuge 10. A plurality of small apertures 36 are formed in the surface of first counterbore 25.

Figures 4, 4A:
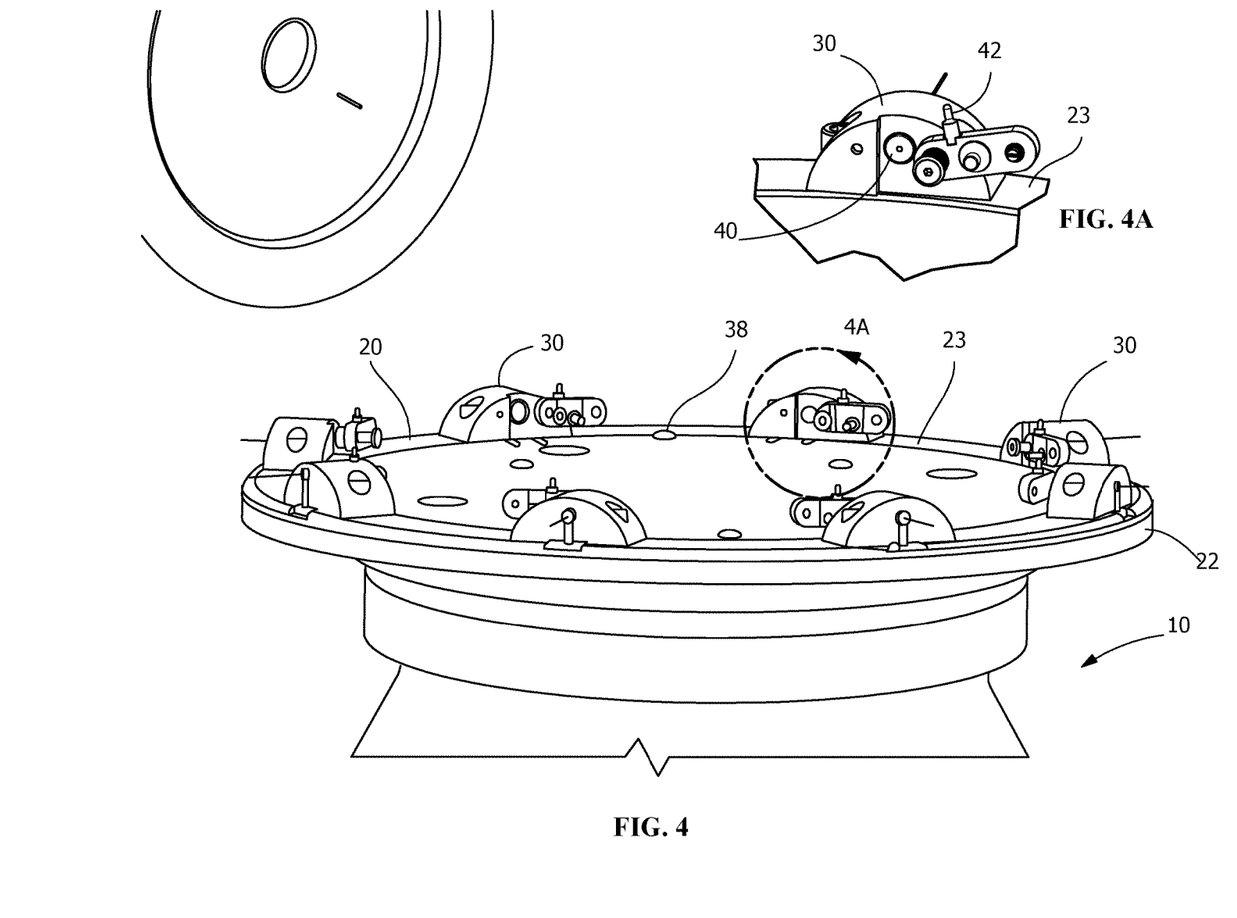
FIG. 4 is an oblique view at a shallow angle of the test platform having a PC board installed into the first counter-bore of the test platform, the test fixtures being in an unlocked position.
FIG. 4A is an inset showing a detail view of one of the test fixtures of FIG. 3 with a kinetic switch assembled to it.

FIG. 4 is an oblique view depicting a centrifuge 10 with the test platform 20 mounted over and secured to the center shaft, which is partially obscured from view in FIG. 2. A PC board (PCB) 32 is shown assembled into first counterbore 25 of test platform. PCB 32 is held in place within first counterbore by a second set of fasteners, depicted in FIG. 4 as flanged capscrews 38 extending through PCB and into apertures 36 formed in the surface of first counterbore 25, see also FIG. 3. Also visible along test platform 20 are the plurality of equally spaced test fixtures 30 removably attached to test platform 20 near its periphery 22. Each test fixture 30 also includes a locking mechanism to secure each kinetic switch to it. Although depicted and described as integral, the locking mechanism may be non-integral with test fixture 30, as long as the locking mechanism locks and secures the kinetic switch to the test fixture during testing. How the locking mechanism secures the kinetic switch to the test fixture during testing is not a critical feature of the invention, as long as the locking mechanism accomplishes the task of locking the kinetic switch to the test fixture during centrifuge operation. Thus any locking mechanism that reliably performs this task is considered an equivalent mechanism.

The plurality of test fixtures 30 are equally spaced around test platform 20 so that the centrifuge will remain in balance when operating at high speeds. Thus, the angular spacing of the sensors is $$360/n \qquad \text{(equation 1)}$$

where n=number of test fixtures. As shown in the Figures, there are 8 test fixtures, so the angular spacing among the test fixtures is 45°.

FIG. 4A is a detail view of one of the plurality of test fixtures 30 mounted on platform flange 23. In FIG. 4A, test fixture 30 is depicted in the open (or unlocked) position with kinetic switches assembled. Visible in FIG. 4A is a first gold spring loaded contact or POGO 42.

Figure 5:
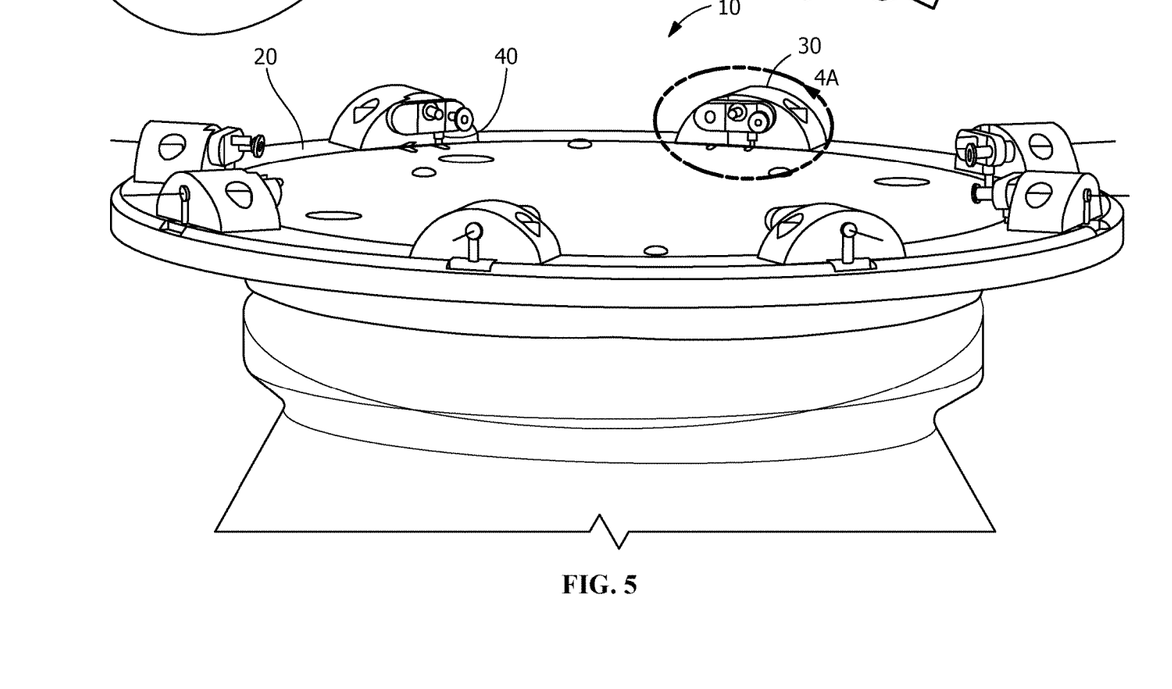
FIG. 5 is an oblique view at a shallow angle of the test platform having a PC board installed into the first counter-bore of the test platform, the test fixtures being in a locked position.
Figure 5A:
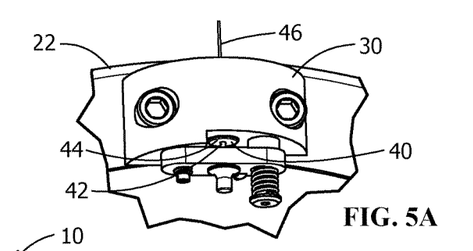
FIG. 5A is an inset showing a detail view of one of the test fixture of FIG. 4 with a kinetic switch locked into place within it.

FIG. 5 is a view similar to FIG. 4 showing kinetic switches 40 locked into position in each test fixture 30. In FIG. 5A, a kinetic switch 40 is locked into test fixture 30. Kinetic switch 40 includes a shell portion 44, which is in contact with first POGO 42. Kinetic switch 40 also includes a lead portion 46 that extends beyond platform periphery 22. Shell portion 44 of kinetic switch 40 is shown in contact with POGO 42. Lead portion 46 of kinetic switch 40 connects to a female contact in electrical contact with trace 60 on PCB 32, see FIG. 6. Shell portion 44 of kinetic switch 40 contacts POGO 42 that is in electrical contact with a second trace on PCB 32. A preferred arrangement for accomplishing this electrical contact is by soldering POGO 42 through an interface board to a second POGO that makes contact to the second trace on PCB 32. However, any other connection that accomplishes the electrical contact to complete the circuit may be used.

Figure 6:
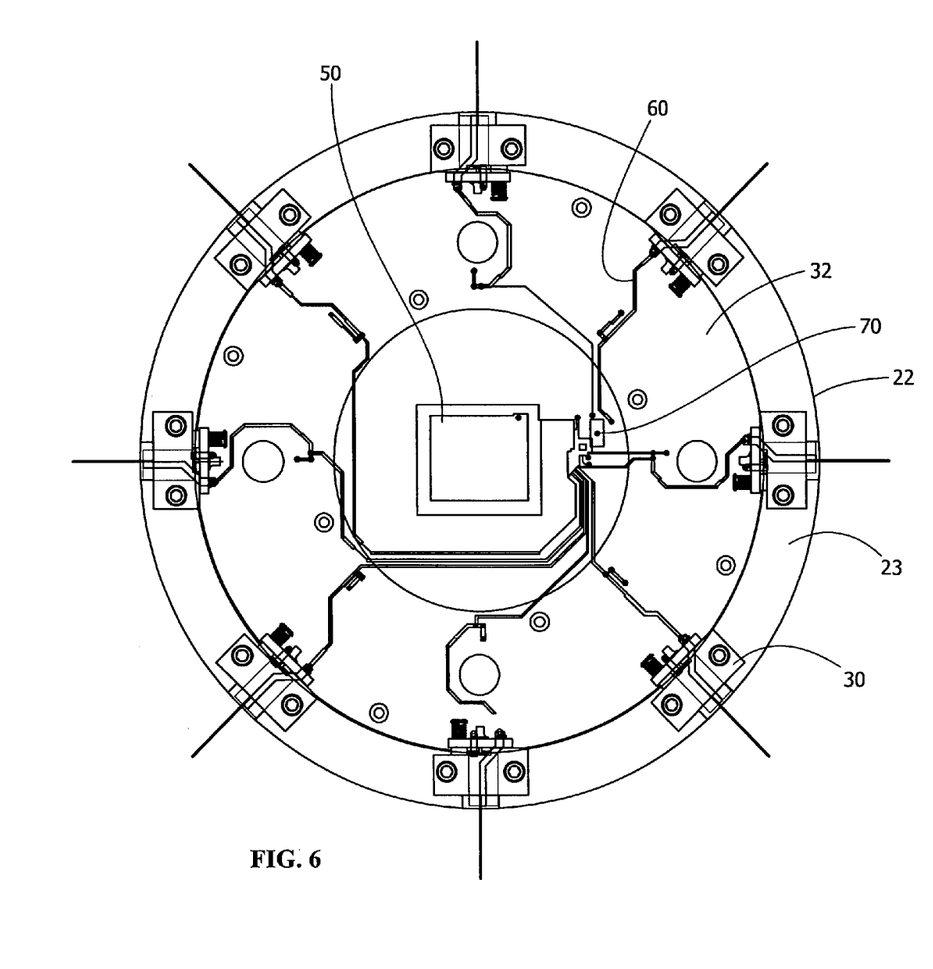
FIG. 6 is schematic of the top view of the PC board of FIG. 4 depicting the PCB with an assembled RFID device and conductive traces, and connections with the plurality of test fixtures.

FIG. 6 is an embodiment of the PCB 32 used in the present invention. This provides one arrangement for a PCB for assembly to a test platform 20 having eight test fixtures 30. Other PCB designs may be used and other PCB designs would be implemented when additional or fewer test fixtures are incorporated into the test apparatus. Of course, the embodiment shown may be used when fewer than eight kinetic switches are tested, as long as proper balance can be obtained for testing. In FIG. 6, the RFID device 50 is an RFID chip, microchip or integrated circuit 52 is affixed to PCB 32. As previously noted, PCB 32 preferably is mounted in a platform recess or first counterbore 25 of test platform 20. RFID device 50 is in communication with each of the plurality of kinetic switches 40 removably assembled to test fixtures 30 as discussed above and depicted in FIGS. 5 and 5A. Eight test fixtures 30 are shown in FIG. 6 corresponding to the number of test fixtures depicted in FIGS. 4 and 5, but the number of test fixtures 30 and associated circuitry may vary as previously discussed. As shown in FIG. 6, RFID device 50 is connected to each of test fixtures 30. The connection may be accomplished by any connection device, most typically an electrical trace 60. Also shown in FIG. 6 is an antenna compensator 70 designed to tune antenna 56 of RFID device 50 to the specific frequency required to match the frequency of scanning antenna 59 mounted in centrifuge lid 16 enabling communication between hardware mounted in centrifuge 10 with ancillary equipment. As depicted in FIG. 6, RFID device is depicted connected to eight test fixtures, each test fixture configured to detect movement of a kinetic switch from a first position to a second position and to provide a signal indicative of the movement to RFID device 50. In FIG. 6, one RFID device is depicted affixed to PCB 32 and the plurality of test fixtures. However, more than one RFID device 50 may be affixed to PCB 32 of each test platform 20. For example, a plurality of RFID devices may be affixed to test platform 20, one RFID device 50 corresponding to each of the plurality of test fixtures 30. Any other combination of RFID devices 50 and test fixtures 30 may also be used. The RFID device 50 may be removably affixed to PCB 32 which is removably affixed to test platform 20. Thus, RFID device 50 may be removed from PCB 32 and replaced as required, and PCB 32 may be removed from test platform 20 as required. Of course, PCB 32 having an affixed RFID device 50 may be removed from test platform 20 as a unit. Test platform 20 is removable from centrifuge and each of the plurality of test fixtures is removable from test platform 20. Thus, repairs and replacement to the kinetic switch testing system are readily accomplished.

RFID device 50 may be affixed to PCB 32 by any known technique. Preferably, it may be affixed to PCB 32 mechanically or using a solvent-removable adhesive.

As shown in FIG. 6, RFID device is connected to test fixtures 30 via conductive traces 60. POGOS 42, which are spring loaded contacts, provide the contact or communication between traces 60 and traces on PCB 32, while facilitating assembly and removal of kinetic switches 40 from test fixtures 30.

As shown if FIG. 6, one RFID device 50 may be configured to receive information from more than one test fixture 30 associated with the test platform 20, or more than one RFID device 50 may be utilized to communicate with the test fixtures 30.

A separate sensor provided as an encoder is provided with centrifuge 10 monitoring its speed. Encoders are well known devices for determining the speed of a rotating shaft, such as used with electric motors, although any other speed-monitoring device may be used to monitor the speed of centrifuge 10. When a separate speed monitoring sensor is used to monitor the speed of centrifuge 10, the speed monitoring sensor need not be associated with RFID device 50. A plurality of kinetic switches 40 may be mounted along the platform periphery 22 of a centrifuge 10, the plurality of kinetic switches 40 being secured to the plurality of test fixtures 30 so that they cannot disengage during centrifuge operation.

Figure 7:
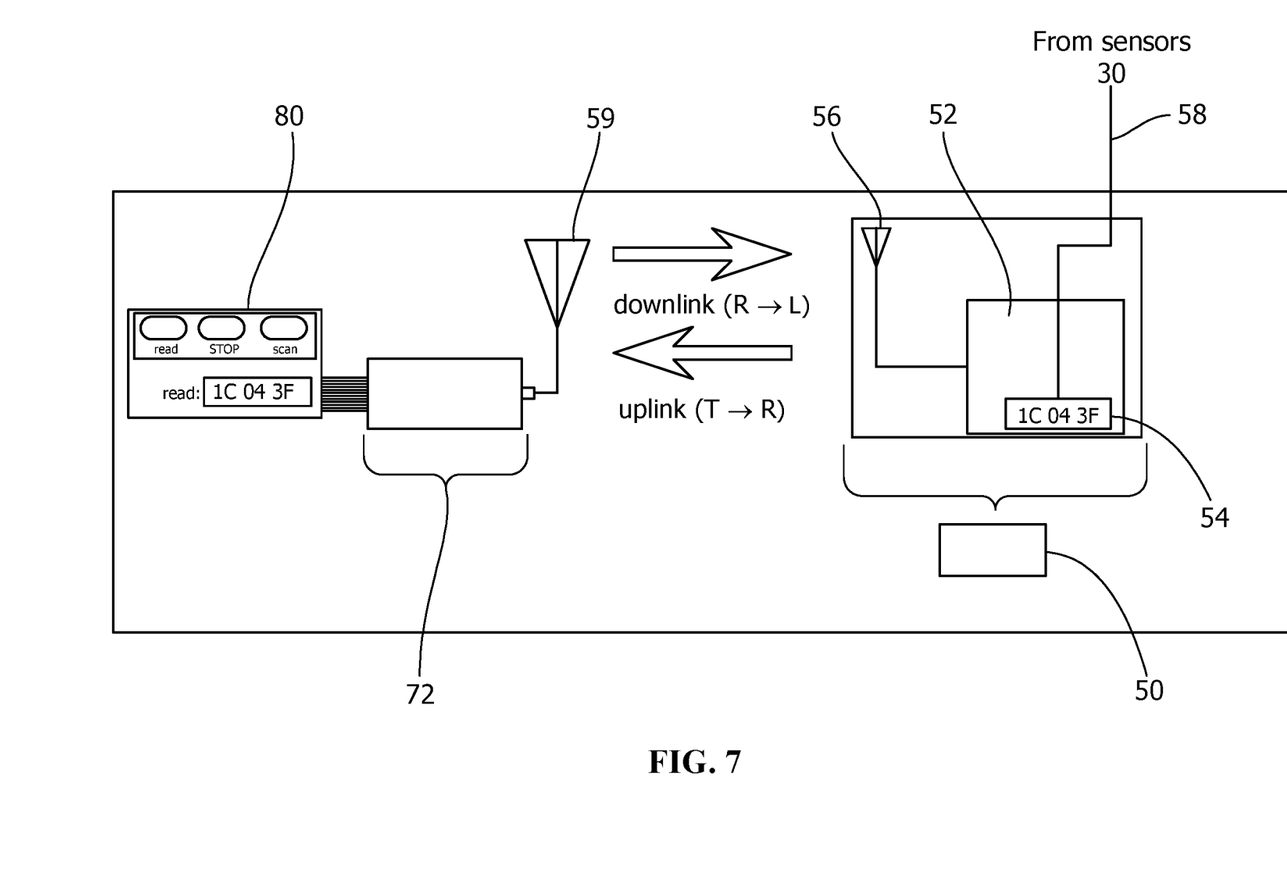
FIG. 7 depicts a block diagram of an RFID system.

FIG. 7 illustrates a typical RFID system used for testing kinetic switches on a centrifuge. The RFID system utilized in testing kinetic switches operates in a similar manner to other RFID systems. RFID device 50 is removably affixed to test platform 20 as discussed above. RFID device 50 includes an antenna 56 and optionally may include an integrated circuit and memory storage 54. Input 58 is provided from test fixtures 30, for example, along traces 60 such as shown in FIG. 6. Also depicted in FIG. 7 is scanning antenna 59, also depicted in FIG. 2 installed in a stationary portion of the centrifuge. Scanning antenna 59 is in wireless communication with RFID device 50, such as by radio frequency (RF) communication. As shown, scanning antenna is in electronic communication with a signal analyzer 72, which can include an analog-to-digital (A/D) signal converter as well as signal conditioning capabilities. Signal analyzer 72 is in communication with a computer 80 which receives the processed signals from the signal analyzer. A custom computer program then performs calculations and further processes the information and has memory that stores information. It will be recognized by those skilled in the art that signal analyzer 72 may be combined into the computer 80 either separately from or combined with the custom computer program. It will also be recognized that optionally an elaborate microchip 52 can be designed for the RFID system that includes A/D signal conversion circuitry and calculation circuitry, so that all data indicative of test results are stored on RFID device 50 which is then transmitted from RFID device 50 to scanning antenna 59. In this circumstance, scanning antenna 59 only must transmit the data to a unit having memory storage capabilities, as all conditioning and calculations are performed prior to transmission from RFID device 50. There are many arrangements possible in which the raw data from the test is transmitted from the RFID device 50. The particular arrangement that is selected is not important, as the unique capabilities of the RFID system to wirelessly transmit test data, either raw data or conditioned data, after surviving a high-RPM, speed test in a centrifuge 10 make each of these various equivalent arrangements viable, which was not previously possible.

In operation, test fixtures 30 with installed kinetic switches 40 mounted thereto are assigned corresponding locations in RFID device identifying a specific kinetic switch 40 associated with a specific test fixture. The centrifuge 10 is accelerated to a predetermined speed. When the forces of the rapidly spinning centrifuge 10 are sufficiently high, kinetic switch 40 moves from a first position to a second position. The test fixture 30 associated with kinetic switch 40 then sends a signal indicating that the monitored event has occurred. The speed of centrifuge 10 is constant so that the force applied to the kinetic switch(es) 40 when the switch moves from a first position to a second position, that is when the switch changes state, is known or can be calculated. The speed of the centrifuge at event occurrence is required to determine/calculate the force on a kinetic switch at the time of event occurrence. In another embodiment, test fixture 30 may, in addition to monitoring movement of kinetic switch 40 from a first position to a second position, also include an accelerometer that can measure the force on kinetic switch 40 when kinetic switch moves from a first position to a second position and sends a signal to RFID device 50 indicative of the force at the time of switch movement. As discussed previously, the speed of the centrifuge also may be provided by an encoder associated with the motor, or the speed of the centrifuge also may also be monitored by an independent sensor.

The movement of kinetic switch 40 from a first position to a second position generates a signal that is transferred to RFID device 50. The sensor associated with each of the plurality of test fixtures 30 for detecting movement of the kinetic switch 40 may be as simple as an electrical circuit which opens or closes in response to kinetic switch moving from a first position to a second position, generating an electrical signal that is sent to RFID device 50. Although such an electrical circuit is the preferred method of practicing the present invention, any other sensor design that can monitor the movement of kinetic switch from a first position to a second position may be utilized in test fixtures 30.

The signal generated by movement of the kinetic switch is transferred to RFID device 50. In its simplest form, the signal as raw information is transferred to the RFID device 50. When so equipped, test fixtures 30 may transmit signals indicative of centrifuge speed or information that permits calculation of centrifuge speed. As previously noted, RFID device 50 may include circuitry that permits signal processing and/or further calculation. In whatever form, the information indicative of kinetic switch 40 at a test fixture location moving from a first position to a second position is either transmitted by RFID device 50 in real time or stored in memory storage 54 when so equipped of RFID device 50 for transmission at a later time, each test fixture being associated with a predetermined memory storage location. This memory storage location may include the actual serial number of kinetic switch 40 being tested, this information having been input from scanning antenna 59 and connected equipment before the test is initiated. Alternatively, the serial number identification of the kinetic switch 40 associated with a particular test fixture 30 may be matched to the memory storage location after the information is uploaded from RFID chip 50.

Scanning antenna 59 interrogates RFID device 50, that is, it sends a signal to RFID device 50 to upload the contents in its memory storage 54. Simultaneously, the RF signal from scanning antenna 59 provides power, utilizing received RF energy to operate RFID device 50, when RFID device 50 is a passive chip, by a conversion method that may include, but is not limited to, passive-inductive coupling. These power requirements are very low and typically can be supplied by frequencies in the RF range. On receiving this information, data received by RFID device 50, whether in real time or as stored contents of memory storage 54 when so equipped are transmitted to scanning antenna 59 via antenna 56. RFID device 50 may be programmed to transmit the data as it is received in real time or from memory storage 54. When equipped with memory storage capabilities, the signal for interrogation of RFID device 50 may be sent at any time, most typically after the centrifuge has stopped operation. After the information has been transmitted, RFID device 50 may automatically be programmed to clear its memory when so equipped, or the computer, after receiving information, may generate an instruction to scanning antenna 59 to send a signal to RFID chip to clear its memory storage 54. Any other acceptable method of clearing memory storage 54 after the information has been transmitted may be used.

Scanning antenna 59 receives the information transmitted by device 50. Depending on the capabilities of the microchip associated with RFID device 50, the information transmitted by RFID device 50 may be a simple 0, 1 signal indicative of switch opening or closing, other raw data requiring conditioning, filtering and analysis, or it may provide the force at which a kinetic switch moved from a first position to a second position at a particular test fixture location. In the embodiment depicted in FIG. 7, signal information is transferred from RFID device 50 to scanning antenna 59. This signal information is then communicated to signal analyzer 72, which conditions the signal information and performs an ND signal conversion before transmitting the digital information to computer 80. The signal analyzer may be an independent device or may be integrated into a custom computer program. Computer 80, using the digital information, determines the force at which each kinetic switch 40 moved from a first position to a second condition so that acceptance criteria can be applied to each kinetic switch. Acceptance criteria will vary depending on the performance requirements and application of the kinetic switch. Kinetic switches are designed to change state, that is, move from a first position to a second position at a predetermined force, which correlates to a predetermined centrifuge speed. A broad acceptance criteria would allow an acceptable kinetic switch to open within a predetermined range, for example, ±15% of the design speed, although this range may be more stringent depending on the application. Switches that open before the predetermined range is reached, or that do not open within the limits of the range are deemed to have failed the testing. In addition, switches that cycle from one position to another position within the range during testing are deemed to have failed the test.

Of course, the speed of centrifuge 10 is necessary to determine force. Any method of assessing the speed of the centrifuge when a kinetic switch 40 moves from a first position to a second position may be used. Several methods have been discussed above, including motor encoders associated with the centrifuge motor or accelerometers associated with each test fixture 30 that record the force of the rotating centrifuge when kinetic switch 40 moves from a first position to a second position. Once the speed is known, the force at which kinetic switch moves from a first position to a second position can then be determined. As noted, this may be done by circuitry on RFID device 50 or by other calculating devices such as computer 80 depicted in FIG. 7 after RFID device 50 has been interrogated. The force G may be calculated using the following equations $$G = r * \omega^2 / g \quad \text{(equation 2)}$$

$$\omega = 2 * \pi * \text{rpm}/60 \quad \text{(equation 3)}$$

where r is the radius from the axis of the centrifuge center shaft to the position of the kinetic switch on the test apparatus, $\omega$ is the angular velocity of the centrifuge, g is the standard acceleration of gravity, 9807 mm/sec$^2$ and rpm is the speed of the centrifuge in revolutions per minute. This leads to $$G = 0.000001118 * r * (\text{rpm})^2 \quad \text{(equation 4)}$$

where r=radius in millimeters, and $$G = 1.118 * r_1 * 25.4 * (\text{rpm}/1000)^2 \quad \text{(equation 5)}$$

Where $r_1$=radius in inches

The calculation using equation 4 or 5 may be performed to determine the force G by circuitry on RFID chip 50, computer 80 or by hand when kinetic switch 40 moves from a first position to a second position as the centrifuge is rotating at a known speed.

Figure 8:
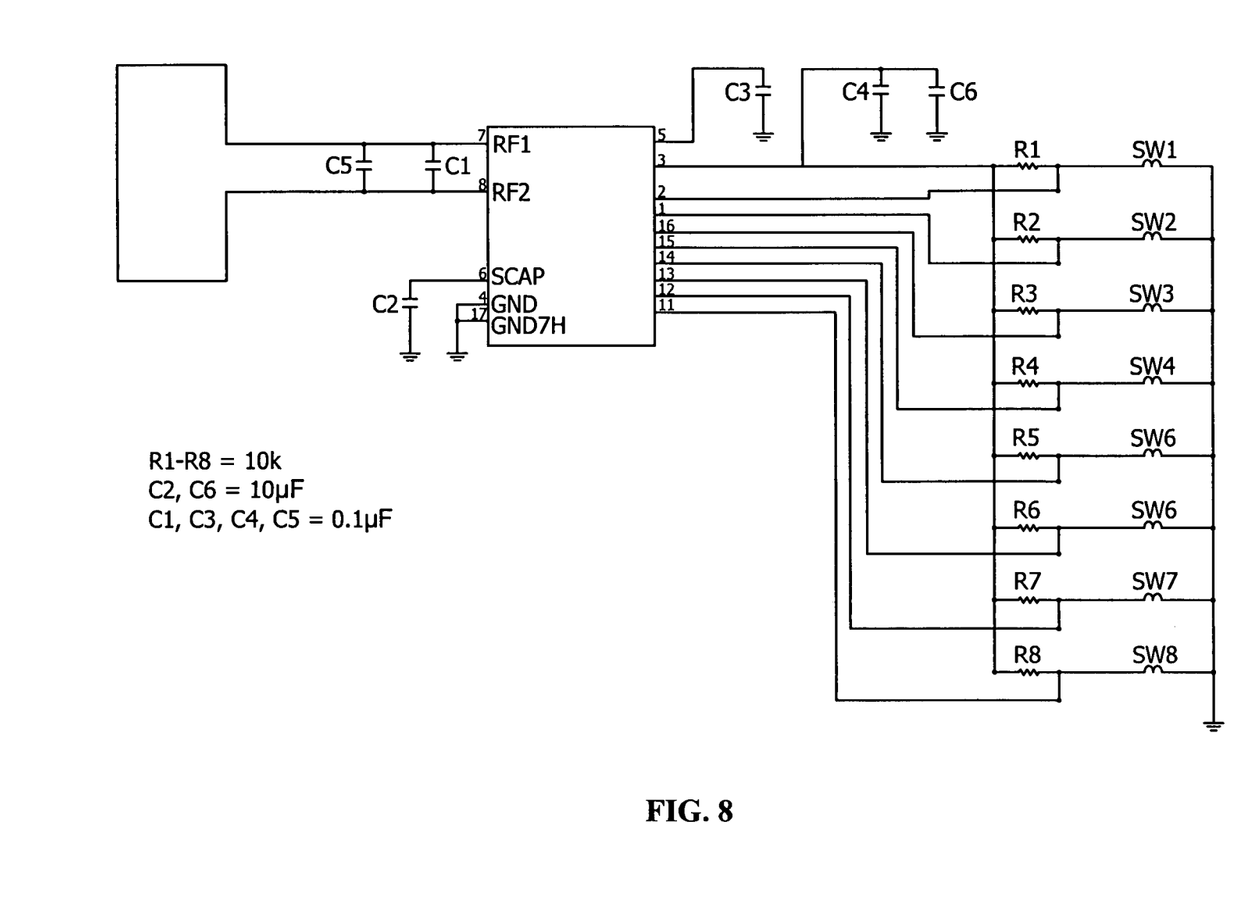
FIG. 8 is a schematic of a test circuit used for testing of kinetic switches with an RFID device.

FIG. 8 provides schematic of an RFID device 50, antenna 56 and test circuits currently in use. The test circuits are located or are associated with test fixtures 30. Although this represents a schematic of the RFID chip which represents the best mode of practicing this invention, it will be recognized by those skilled in the art that this schematic is but one of a number of acceptable schematics for practicing the invention.

Figure 9:
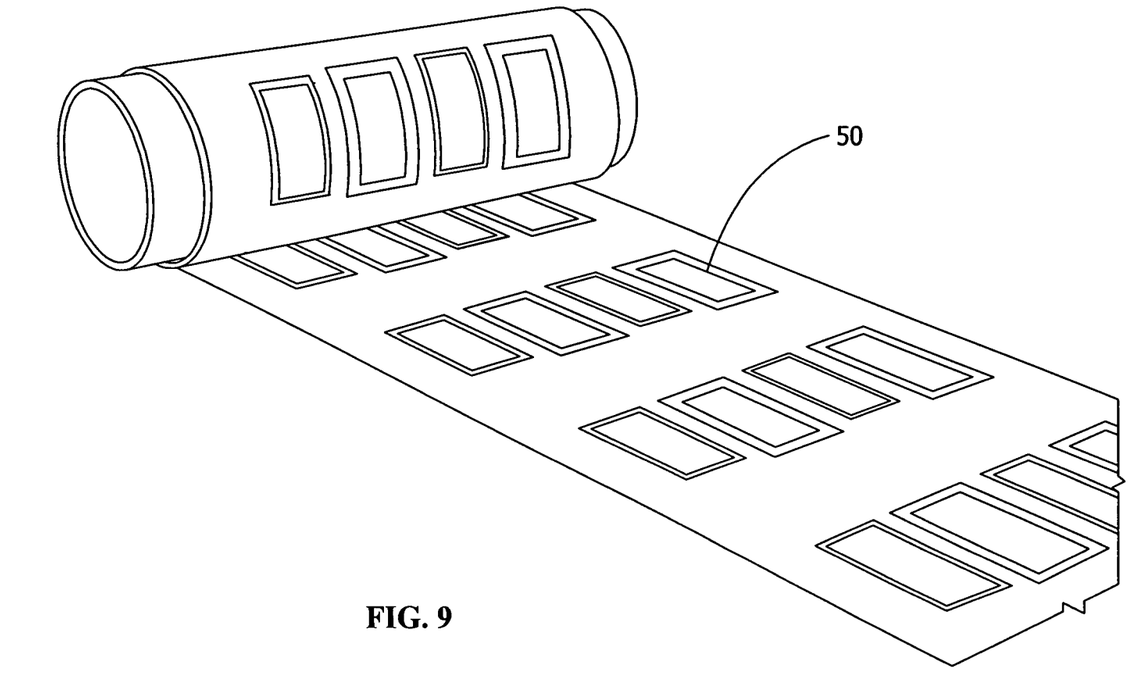
FIG. 9 depicts one form of a plurality of RFID devices provided on flexible film.

FIG. 9 discloses an example of the flexibility and usefulness of RFID devices 50. A roll of RFID devices are printed on a flexible sheet. This roll depicts four devices in each row of the roll and includes a large number of devices. These devices are representative of devices that may be attached to centrifuges 10 employed in the present invention, but are not the devices currently used in the preferred embodiment. However, as illustrated, RFID devices 50 may be cut from a pattern of RFID devices 50, adhered to a centrifuge 10 and connected to test fixtures 30. The RFID devices 50 may be removed and replaced at regular intervals or when a particular test does not inform with data necessary to determine the proper operation of kinetic switches under test, after diagnosis of other sources of problems such as proper connections and proper operation of scanning antenna 59.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A kinetic switch testing system for kinetic switches comprising:
   a high speed centrifuge;
   a centrifuge speed detector;
   a test fixture mounted on the high speed centrifuge, the test fixture including a sensor for sensing a movement of the kinetic switch from a first position to a second position and a unique identification address corresponding to the sensor;
   an RFID system in communication with the test fixture, the RFID system further comprising;
      an RFID device, the RFID device having a computer chip in communication with the sensor and receiving a signal from the sensor indicating movement of the kinetic switch from the first position to the second position, and an antenna,
      a scanning antenna in communication with the RFID device, the RFID device communicating the signal from the sensor indicating movement of the kinetic switch from the first position to the second position and the identification address of the sensor;
   a signal analyzer and a memory storage unit;
   wherein the scanning antenna is in communication with the signal analyzer and the memory storage unit; and
   wherein the signal analyzer and the memory storage unit determine the acceptability of the kinetic switch at the identification address based on centrifuge speed and a signal indicative of the movement of the kinetic switch from the first position to the second position and store data related to testing of the kinetic switch.

2. The kinetic switch testing system of claim 1 wherein the RFID device further includes a second memory storage unit.

3. The kinetic switch testing system of claim 1 wherein the signal analyzer and the memory storage unit that determine the acceptability of the kinetic switch at the unique identification address and store data related to the testing of the kinetic switch is a computer.

4. The kinetic switch testing system of claim 3 wherein the computer further includes a custom computer program that determines the acceptability of the kinetic switch based on movement from the first position to the second position and the centrifuge speed.

5. The kinetic switch testing system of claim 1 wherein the test fixture mounted on the high speed centrifuge comprises a second sensor that includes a signal-producing electrical circuit, the circuit generating a signal when the kinetic switch moves from the first position to the second position.

6. The kinetic switch testing system of claim 1 further including a test platform mechanically attached to the high speed centrifuge.

7. The kinetic switch testing system of claim 6 further including a PC board affixed to the test platform.

8. The kinetic switch testing system of claim 7 wherein the RFID device is removably attached to the PC board and in communication with the test platform.

9. The kinetic switch testing system of claim 8 wherein the RFID device includes a passive chip.

10. The kinetic switch testing system of claim 1 wherein the RFID device is a passive device embedded in a substrate.

11. The kinetic switch testing system of claim 1 wherein the RFID device is an active device.

12. The kinetic switch testing system of claim 1 wherein the centrifuge speed detector is an encoder mounted to a centrifuge motor, the encoder in communication with the signal analyzer and memory storage unit.

13. The kinetic switch testing system of claim 1 wherein the centrifuge speed detector is a centrifuge speed-monitoring sensor, the speed-monitoring sensor monitoring a rotational speed of the centrifuge and in communication with the signal analyzer and memory storage unit.

14. A method for testing a kinetic switch, comprising the steps of:
   providing a high speed centrifuge, a test fixture and an RFID system, a signal analyzer and a memory storage unit, wherein the RFID system further comprises an RFID device having a computer chip, and an antenna, the RFID system further including a scanning antenna in communication with the RFID device;
   mounting the test fixture and the RFID device to the high speed centrifuge;
   placing the test fixture in communication with the RFID device;
   mounting a kinetic switch to the test fixture;
   providing a centrifuge speed detector;
   accelerating the high speed centrifuge;
   sensing the kinetic switch moving from a first position to a second position, a sensor in the test fixture generating and communicating a signal to the RFID device indicative of the unique identification address correspond to the sensor as well as kinetic switch moving from a first position to a second position, the RFID device receiving the signal;
   interrogating the RFID device with a second signal from the scanning antenna;
   transmitting the sensor signal received by the RFID device to the scanning antenna;
   receiving the transmitted sensor signal from the RFID device by the scanning antenna;
   providing a signal analyzer and a memory storage unit;
   transmitting the sensor signal to the signal analyzer and the memory storage unit;
   transmitting a signal from the centrifuge speed detector indicative of centrifuge speed to the signal analyzer and the memory storage unit; and
   analyzing and storing data related to the testing as well as the acceptability of the kinetic switch and its identification address.

15. The system of claim 14 wherein the step of providing an RFID system further includes steps of
   providing an RFID device with a second memory storage unit;
   storing the sensor signal in the second memory storage unit; and
   transmitting the sensor signal from the second memory storage unit of the RFID device upon interrogating the RFID device.

16. The method of claim 14 wherein the step or providing a centrifuge speed detector includes providing an encoder mounted to a centrifuge motor, the encoder in communication with the signal analyzer and memory storage unit.

17. The method of claim 14 wherein the centrifuge speed detector is a centrifuge speed-monitoring sensor, the speed-monitoring sensor monitoring a rotational speed of the centrifuge and in communication with the signal analyzer and memory storage unit and providing a third signal indicative of centrifuge speed to the signal analyzer and the memory storage unit.

18. The method of claim 14 wherein the step of providing the signal analyzer and the memory storage unit further includes providing a computer that includes the signal analyzer and the memory storage unit.

19. The method of claim 18 wherein the step of providing a computer further includes providing a computer having a custom computer program that determines the acceptability of the kinetic switch based on movement from the first position to the second position and the centrifuge speed.

20. The method of testing the kinetic switch of claim 19 wherein a signal information generated by the sensor received by the scanning antenna and the speed of the centrifuge are sent to the computer for calculation of a force on the kinetic switch at the time it moved from the first position to the second position.

21. The method for testing a kinetic switch of claim 14 wherein the step of mounting the test fixture and the RFID device to the high speed centrifuge further includes mechanically mounting a test platform to the high speed centrifuge, mechanically mounting a board to the test platform and mounting the RFID device to the board.

22. The method of claim 14 wherein the step of sensing includes generating an electrical signal when the kinetic switch moves from the first position to the second position opening or closing a circuit.

23. A method for testing a kinetic switch, comprising the steps of:

providing a high speed centrifuge, a test fixture and an RFID system, a signal analyzer and a memory storage unit, wherein the RFID system further comprises an RFID device having a computer chip, and an antenna, the RFID system further including a scanning antenna in communication with the RFID device;

mounting the test fixture and the RFID device to the high speed centrifuge;

placing the test fixture in communication with the RFID device;

mounting a kinetic switch to the test fixture;

accelerating the high speed centrifuge;

interrogating the RFID device with a signal from the scanning antenna;

sensing the kinetic switch moving from a first position to a second position, a sensor in the test fixture generating and communicating a signal to the RFID device indicative of the kinetic switch moving from a first position to a second position;

receiving the generated signal by the sensor in the test fixture, by the RFID device;

transmitting the signal information as it is received by the RFID device;

receiving the transmitted signal information from the RFID device by the scanning antenna;

analyzing the signal information to determine a force at which the identified kinetic switch moved from the first position to the second position; and determining the acceptability of the kinetic switch.

* * * * *